United States Patent [19]

Clough

[11] Patent Number: 5,643,392

[45] Date of Patent: Jul. 1, 1997

[54] METHOD OF AND APPARATUS FOR DELAMINATING IMAGING MEDIA

[75] Inventor: Arthur H. Clough, Hardwick, Mass.

[73] Assignee: Polaroid Corporation, Cambridge, Mass.

[21] Appl. No.: 358,343

[22] Filed: Dec. 19, 1994

[51] Int. Cl.$^6$ .................................................. B32B 35/00
[52] U.S. Cl. .................. 156/344; 156/584; 271/280; 271/285; 430/256; 396/661
[58] Field of Search ................................ 156/344, 584; 271/280, 281, 285; 430/256, 257, 258, 259, 260, 261; 354/354

[56] References Cited

U.S. PATENT DOCUMENTS

| | | | |
|---|---|---|---|
| 5,366,582 | 11/1994 | Freeman et al. | 156/584 |
| 5,478,434 | 12/1995 | Kerr et al. | 156/584 |

*Primary Examiner*—Mark A. Osele
*Attorney, Agent, or Firm*—Leslie Payne

[57] ABSTRACT

A method and apparatus are provided which act to peel different types of dry laminar imaging media having different peel attributes.

39 Claims, 15 Drawing Sheets

METHOD OF AND APPARATUS FOR DELAMINATING IMAGING MEDIA

CROSS REFERENCE TO RELATED APPLICATIONS

The present invention is related to commonly assigned and copending U.S. patent application Ser. No. 08/343,224, entitled "MEDIA TABBING APPARATUS AND METHOD"; filed on Nov. 22, 1994.

BACKGROUND OF THE INVENTION

The present invention relates generally to apparatus and methods for delaminating or peeling thin laminated sheets of material and, in particular, to a method of and apparatus for adjustably delaminating sheets of dry laminar imaging media having different peeling characteristics.

Prior systems are known for processing sheets of dry laminar imaging media by delaminating or peeling certain layers therefrom following the formation of images thereon. One such approach is described in commonly assigned U.S. Pat. No. 5,159,352, wherein images are formed on a thermographic type of dry laminar imaging media by the selective application of heat to discrete areas of the medium. In this regard, one sheet of the medium of the thermographic medium comprises a substrate or "keeper" layer or sheet, an overlying peel sheet or "throwaway" layer adhesively connected by an intermediate multicomponent image forming layer which may include pigment material and a binder therefor. In the laminar composite sheet structure the adhesive bond between the substrate sheet and the image forming layer is, in its initial unexposed state, greater than the bond strength between the peel sheet and the image forming layer. As a result of exposure to thermal energy applied by lasers, the bond between the exposed portions of the image forming layer and the peel sheet becomes stronger than the bond existing between the substrate and the image forming layer. Portions of the image forming layer which have been exposed can be separated from portions which have not been exposed by delaminating the peel sheet from the substrate; whereby complementary images are formed on the respective peel sheet and substrate. Peeling layers from a thin laminate such as described above is, however, an extremely delicate process because commercially objectionable image artifacts can be introduced into the final images if the adjacent exposed and unexposed portions are not peeled in the intended manner.

The sheet delamination apparatus of the invention can be employed for the processing of various types of dry laminar imaging media, including those which provide images by resorting to different imaging mechanisms than heat. Such media forms the complementary images thereon by the selective application of different sources of energy. In the field of graphics arts imaging, there is a need for one imaging medium designed for the production of a duplicate of an original (i.e., a right-reading positive image, referred to as a "dupe" image) and another imaging medium for the production of a right-reading negative image of the original (referred to as a "contact" image). It will be appreciated that laminar imaging media of "dupe" and "contact" types will be based upon different chemical formulation and will provide their respective images by the operation of different imaging mechanisms. Accordingly, the forces required for separating the respective layers will differ in a predetermined manner.

It is, therefore, highly desirable to be able to use the same apparatus for optimally peeling different imaging types of imaging media having respectively different peeling characteristics.

SUMMARY OF THE INVENTION

In accordance with the present invention, there is provided a method of and apparatus for delaminating sheets of peel-apart dry laminated imaging media. Included in an apparatus which embraces the invention is a frame assembly, and a delaminating means. The delaminating means is associated with the frame assembly and is operative for delaminating sheets of media which are fed along a path to a delaminating station. Provision is made for a delaminating means operatively associated with the frame assembly and being operative for delaminating a peelable layer from a remaining keeper layer of the dry imaging medium. The delaminating means of this invention is adjustable for delaminating sheets of imaging medium having respectively different predetermined peeling attributes.

In one illustrated embodiment, the delaminating means is adjustable and includes a main peeling assembly, and an auxiliary peeling assembly. The main peeling assembly is stationed to engage a sheet of one kind of dry peel apart imagine medium which advances therepast so as to effect a peeling between keeper and throwaway layers. The auxiliary peeling assembly is movable into and out of operative relationship with the main peeling assembly. When it is in the operative position, the auxiliary peeling assembly facilitates peeling of an imaging sheet medium having different peeling attributes than the kind peeled by the main peeling assembly. When the auxiliary peeling assembly is moved to its inoperative position, it allows the main peeling assembly to be operative for peeling the first kind of medium.

In an illustrated embodiment, the delaminating means comprises a traction roller assembly which includes a traction peel roller mounted for movement between a sheet medium non-engaging position, and a sheet medium engaging position. Whenever, the traction peel roller is in the engaging position, the traction peel roller engages a throwaway layer of the laminated sheet medium for urging and advancing the throwaway layer portion against a slip surface for effecting peeling.

In another embodiment the traction roller assembly further includes a deflecting device which is coupled to the frame assembly adjacent the peeling station. The deflecting device includes a roller which is movable to an operative position for deflecting the keeper layer sheet at a location downstream of the traction peel roller as the throwaway sheet is being peeled by the traction roller assembly so as to facilitate peeling action.

In another illustrated embodiment, there is provided an adjustable peeling assembly which includes at least first and second peeling assemblies. These peeling assemblies are positionable at the peeling station and extend across a path of the advancing dry peel apart imaging medium. Each one of the first and second peeling assemblies has a peeling edge surface which is configured to peel media having different predetermined peeling characteristics; respectively.

In another illustrated embodiment, the first peeling assembly is stationarily located at the peeling station, and the second peeling assembly is movable between a non-peeling position and a peeling position relative to the first peeling assembly. The peeling surface of the second peeling assembly is in a nested relationship to the peeling surface of the first peeling assembly when the second peeling assembly is in the peeling position, such that the second peeling surface is located to engage the leading edge of an imaging sheet advancing toward it.

In another illustrated embodiment, there is provided an advancing means which includes a tensioning roller assembly for squeezing each medium sheet against one of the first and second peeling assemblies so as to create tension on the advancing sheet, whereby the tensioning roller assembly effects passive advancement of sheets, such that sheets of varying widths and at different locations can be advanced to the peeling station so as to be peeled.

In an illustrated embodiment, the tensioning roller assembly includes a plurality of axially spaced apart elastomeric rollers, each of which acts as a spring independently of the others on the sheet for inducing drag on the sheet and for thereby creating the tension.

In an illustrated embodiment the film advances at preselected speeds dependent on the medium being peeled so as to effect a peeling which is free of imaging artifacts.

In another illustrated embodiment, the first peeling assembly includes a main peeling bar which has an arcuate peeling surface thereon that acts to peel the throwaway sheet and also guides a sheet exiting therefrom into a waste conveying system.

In another illustrated embodiment, the second peeling assembly includes an auxiliary peeling bar assembly which has a peeling profile which is configured so as to peel the imaging media without inducing imaging artifacts.

In an illustrated embodiment, the auxiliary peel bar assembly is advanced between an operative peeling position and an inoperative non-peeling position, whereby the auxiliary peeling bar assembly can peel sheets having different peeling characteristics than the sheets peeled with the main peeling bar assembly.

In an illustrated embodiment, there is provided a deflector roller assembly which is adjustable so as to be operative in at least two conditions, wherein in either one of the two conditions a keeper sheet of the dry imaging medium is deflected by a predetermined amount so as to enhance delamination in a manner which does not form image artifacts.

Among the other objects and features of the present invention, are, therefore, the provisions of: peeling method and apparatus which are adapted for peeling different media having different peeling characteristics; peeling method and apparatus which are adapted for handling different sized sheets simultaneously; peeling method and apparatus which simply and reliably effects peeling of laminated imaging media; peeling method and apparatus which reduces significantly imaging artifacts in the peeled image so that there is virtually no distortion of the image; and peeling method and apparatus which is inexpensive to both manufacture and operate.

BRIEF DESCRIPTION OF THE DRAWINGS

Reference is made to the accompanying drawings in which there is shown an illustrative preferred embodiment of the invention, wherein.

DETAILED DESCRIPTION

Figure 1:
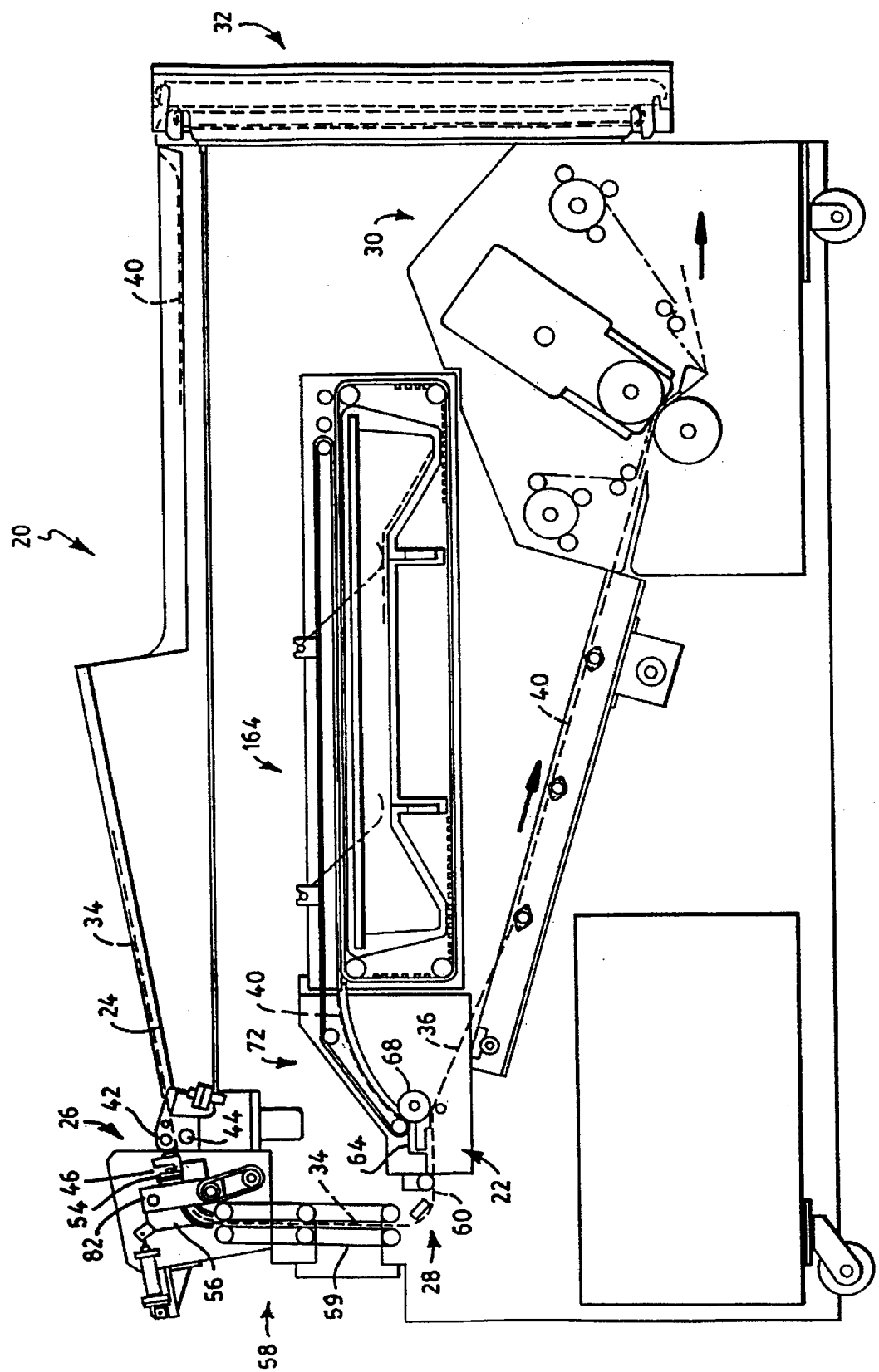
FIG. 1 is an elevational schematic view showing a self-contained peeler and laminator apparatus for the processing of thin laminated sheets of a dry laminar imaging medium which apparatus includes the peeling apparatus of the present invention.

Referring to the drawings and, in particular, to FIG. 1, there is shown a peeler and laminator apparatus 20 in which a peeler or delaminator apparatus 22 of the present invention is incorporated. The peeler apparatus 22 is operative for peeling thin laminated sheets of dry peel-apart imaging media and then laminating at least one of the peeled layers of the imaging sheet. Features of a peeler and laminator apparatus 20 which are necessary for understanding the operation of the peeler or delaminator apparatus 22 of the present invention will be described.

Essentially, the peeler and laminator apparatus 20 includes a sheet feeding station 24, a sheet tabbing station 26, a sheet peeling station 28 at which the peeler apparatus 22 is located, a laminating station 30, and a laminated sheet exiting station 32. The peeler apparatus 22 of this invention is versatile and is operative for peeling a variety of sheets of dry laminar imaging media, such as thermographic or photopolymerizable types of media. For example, the type of thermographic imaging material which can be used can be used is like that described in commonly assigned International Application PCT/03249/US87 published Jun. 16, 1988, under International Publication No. WO88/04237.

Figure 12:
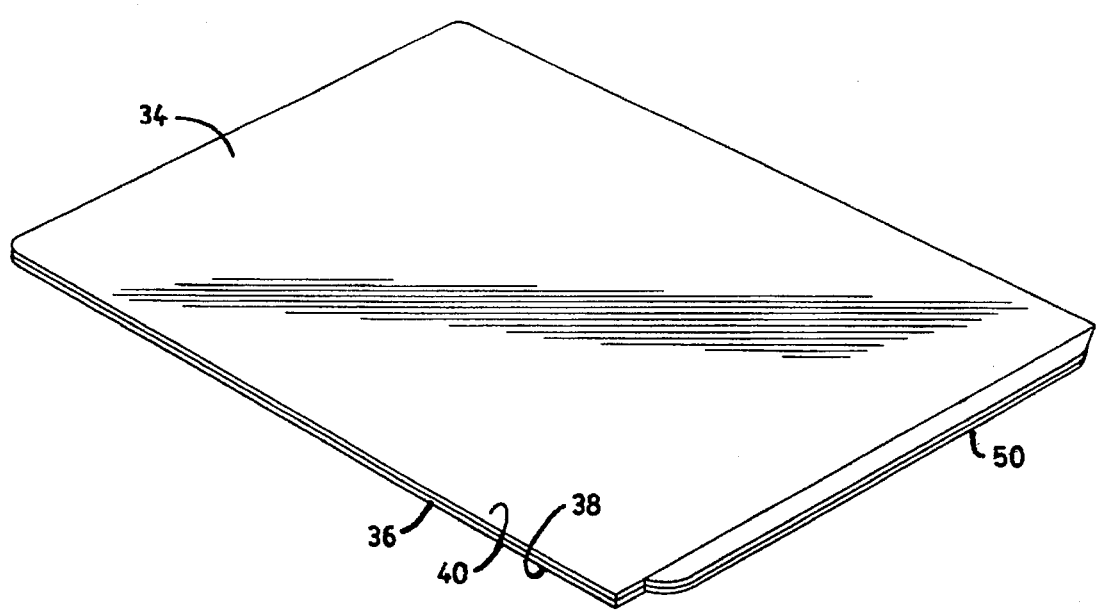
FIG. 12 is a fragmented perspective view of a sheet of dry imaging laminate; and, FIG. 13 is a cross-sectional view of the media which can be peeled in accordance with the present invention.
Figure 13:
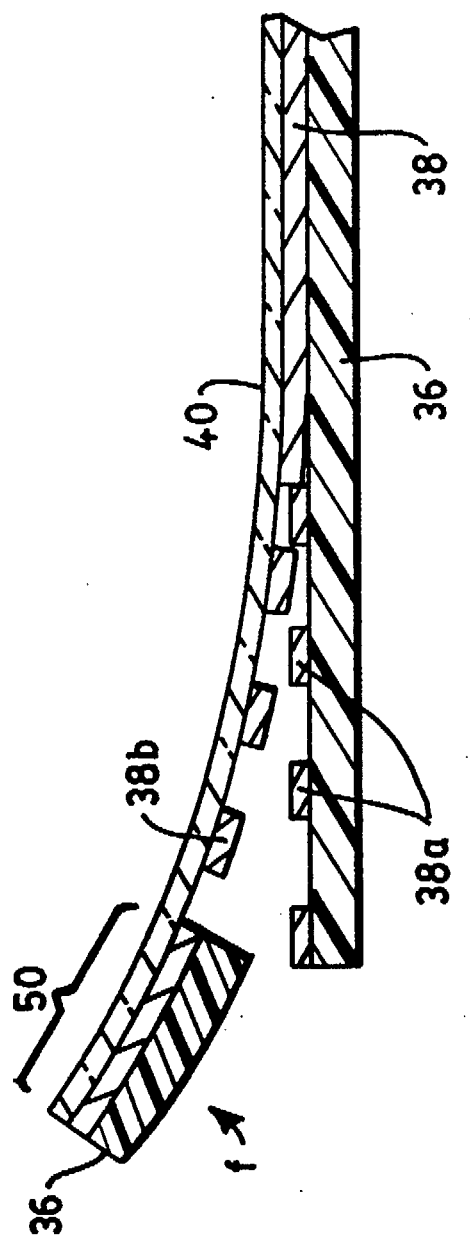

Insofar as other peel-apart dry laminar imaging media are concerned, reference is made to a photopolymerizable material which is depicted in FIGS. 12 and 13. The depicted photopolymerizable laminar imaging sheet medium 34 provides a pair of complementary images (one of which is a duplicate image of an original) and the sheets of which can be separated using the peeling apparatus of the present invention. Such a sheet medium 34 provides a pair of high resolution images and includes a first sheet 36 having superimposed thereon a multicomponent layer 38 which includes in order, a photopolymerizable layer, an image-forming layer comprising a photopolymerizable material (which may be the same as, or different from, the photopolymerizable material present in the photopolymerizable layer) and a dye or pigment, a release layer, an adhesive layer; and, a second or releasable throwaway layer or sheet 40.

One type of imaging medium is imagewise exposed to radiation (typically, near ultra-violet radiation) of a wavelength effective to cause polymerization of the photopolymerizable material(s) present in the photopolymerizable and image-forming layers, this exposure usually being effected through the first sheet. In exposed areas such as 38a, the imaging radiation causes polymerization of the photopolymerizable material(s) present in the photopolymerizable and image-forming layers, and thus increases the adhesion between the exposed portions of the photopolymerizable and image-forming layers, and the first sheet 36. Accordingly, when the first ("keeper") and second ("throwaway") sheets are separated after the imagewise exposure, in exposed areas 38a the photopolymerizable and image-forming layers remain attached to the first sheet and cohesive failure occurs within the release layer to provide an image which is the reverse (i.e., a wrong-reading image) of the original image through which the exposure is made. In unexposed areas such as 38b, the image-forming layer remains attached to the second sheet 40, and cohesive failure occurs within the photopolymerizable layer, to provide a duplicate ("dupe") of the original.

In contrast to the aforementioned imaging medium, a laminar imaging medium which provides a "keeper" image in the form of a negative "contact" image of the original image.

A principal embodiment of such a laminar medium comprises a photoplasticizable layer comprising a macromolecular binder and an onium salt, these components configured such that the layer becomes at least partially plasticized upon exposure to actinic radiation; a layer of a porous or particulate imaging material adjacent to the photoplasticizable layer; a first sheet (cf., cover sheet) secured to the photoplasticizable layer; and a second sheet (cf., support or "keeper" sheet) adhered to the face of the imaging material remote from the photoplasticizable layer. In general, the onium salts selected for such configuration are those capable of generating a plasticizing species in response to irradiation with actinic radiation. After exposure to actinic radiation, the plasticizing species generated from the onium salts plasticizes the macromolecular binder, effectively tackifying the photoplasticizable layer in areas of exposure, these tackified areas presenting areas of reduced interfacial adhesivity between the photoplasticizable layer and the cover sheet. When the cover sheet is separated (i.e., peeled) from the support sheet, irradiated areas are retained on the support sheet to provide a "contact" image, while non-exposed areas are carried away on the cover sheet. In view of its distinct configuration, it will be appreciated that the peel forces desirable for effecting preferred separation conditions for the development of this imaging medium vary from those desirable for the development of the aforementioned laminar imaging medium. Regardless, as made apparent herein, the delaminator of the present invention is well-suited for effecting delamination of either of the noted photopolymerizable medium.

Figure 1A:
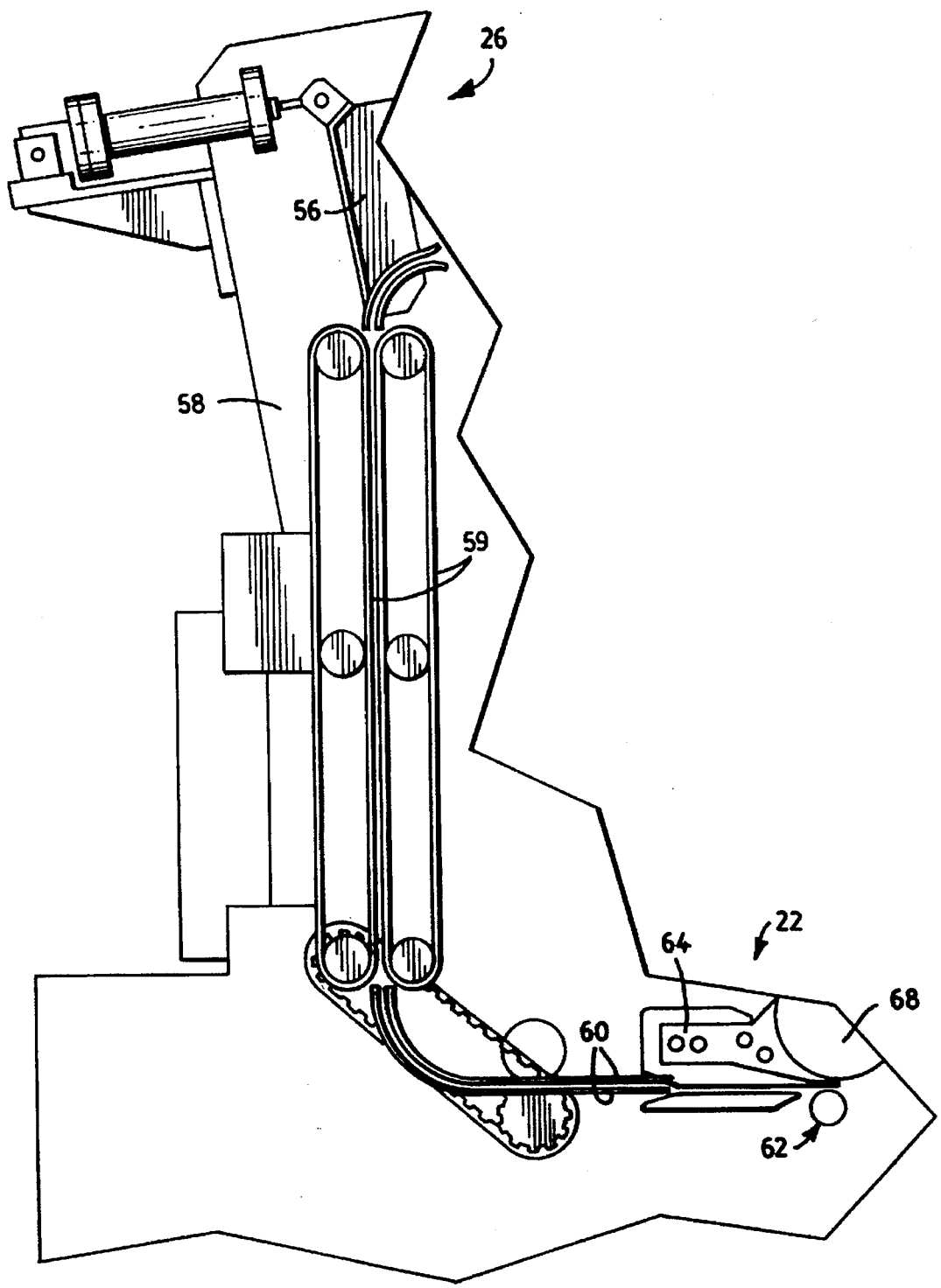
FIG. 1A is an elevational view of a peeler in-feed mechanism forming part of the peeler and laminator apparatus.

Individual ones of the sheets 34 of the imaging media are manually fed to a pair of in-feed nip rollers 42 and 44 of the sheet feeding station 24. The rollers 42 and 44 are operative for advancing imaging sheets to a tabber apparatus 46 located at the tabbing station 26. The sheet feeding station and the tabbing station including the tabber apparatus are like that described in the noted commonly assigned and copending patent application entitled "MEDIA TABBING APPARATUS AND METHOD"; and, a description thereof are incorporated herein by reference. In this embodiment, a plurality of sheets of various sizes can be fed in side-by-side relationship to the tabber apparatus. The tabber apparatus 46 is operative for forming a frangible tab 50 (FIGS. 3 & 12) on a leading edge of each individual sheet 34. The tab 50 is used for initiating delamination of throwaway sheet from the keeper sheet as will be described. The tabber apparatus 46 forms the frangible tab 50 by a transversely reciprocatable shuttle block means assembly 52 carrying a tabbing cutter 54 for scoring the keeper sheet along the latter's forward edge. With the completion of the tabbing, the shuttle block assembly 52 is disposed at either lateral extremity of the sheet feeding path. A chute means or assembly 56 is operated to pivot to the position, depicted in FIG. 1A, whereby the scored frangible tab 50 and associated sheet can enter as it is driven by the peel in-feed nip rollers 42, 44. The chute assembly 56 guides the sheet 34 downwardly to a sheet transporting system 58. The sheet transporting system 58 includes a series of 0-ring conveyor belts 59 (FIG. 1a) which extend transversely between the sideplates of the frame and are driven by a suitable drive system. The sheet transporting mechanism 58 operates to feed the sheets through a pair of arcuately shaped, spaced apart, guide plates 60 which are situated adjacent the entrance to the peeler apparatus 22. The plates 60 extend between the frame sideplates so as to guide a plurality of discrete sheets to the peeler apparatus.

As will be explained, the peeler apparatus 22 is effective for separating the throwaway sheet 40 from the keeper sheet 38 without inducing unacceptable image artifacts in the image on the keeper sheet. The peeling apparatus 22 of this embodiment includes a sheet tensioning assembly 62; a peeling bar assembly 64; peel tractor roller means 68; a keeper deflector roll assembly 70; and, a waste conveyor system 72.

Figure 7:
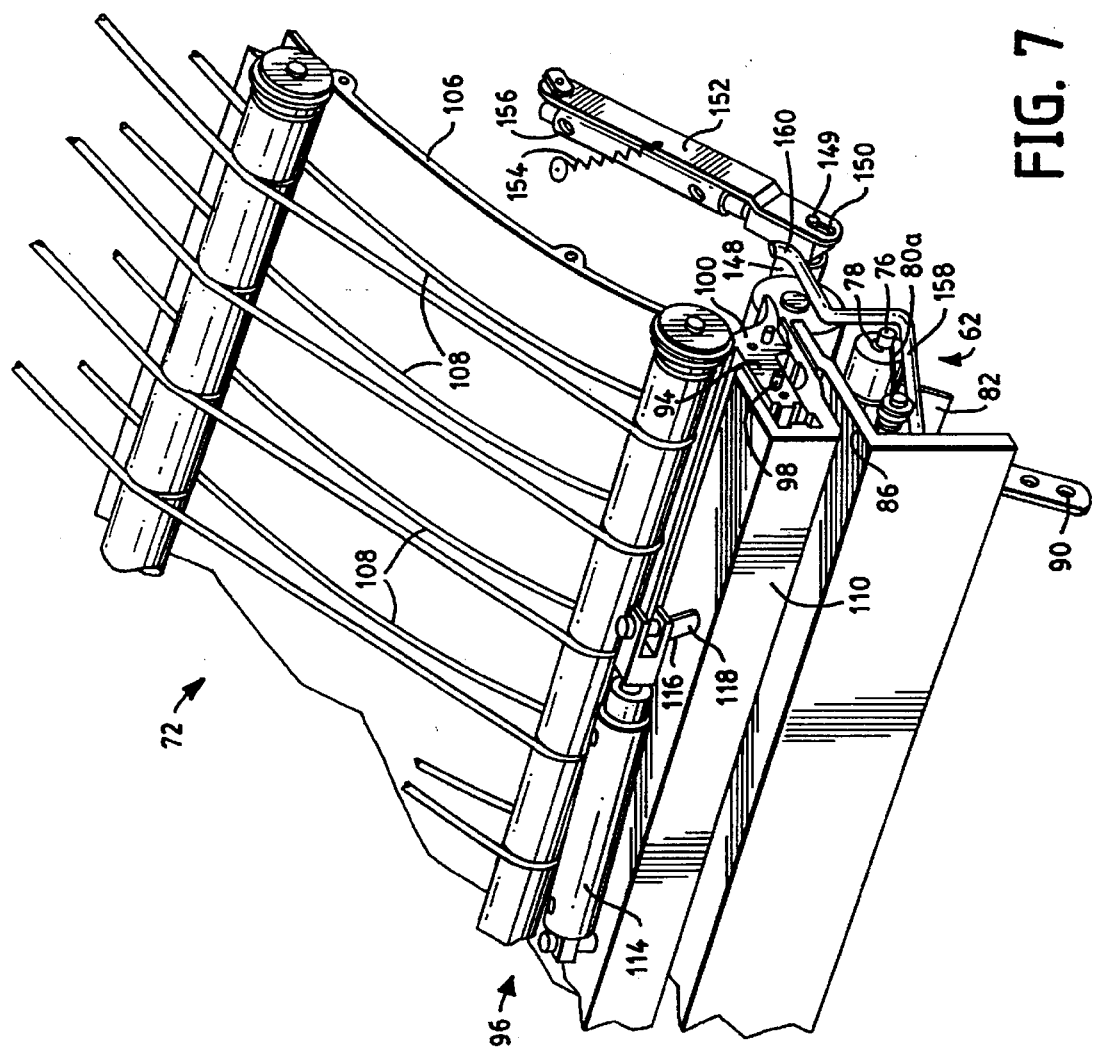
FIG. 7 is an enlarged and fragmented perspective view of some of the components of the peeling assembly of the present invention.
Figure 9:
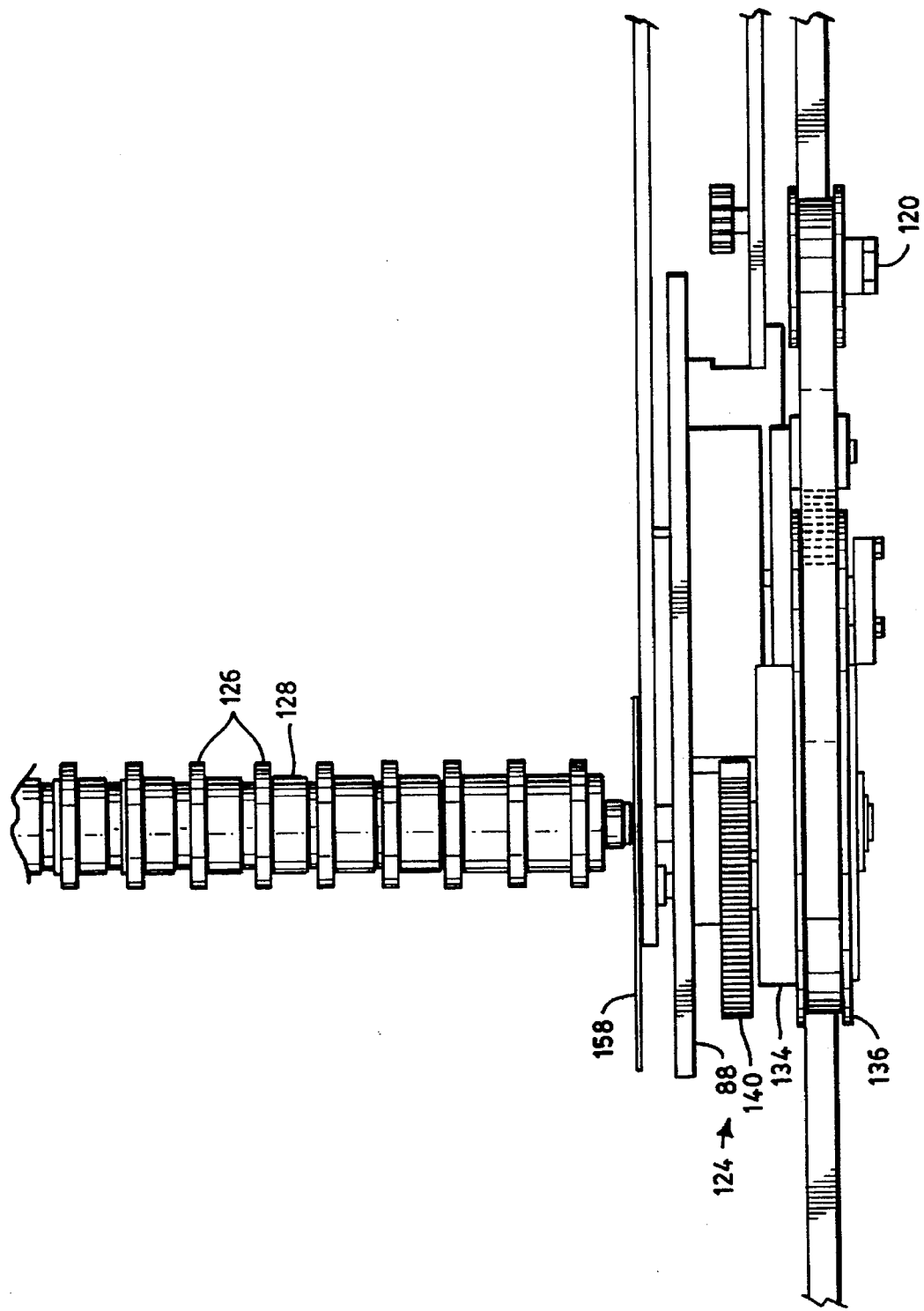
FIG. 9 is a partial plan schematic view of the operative components viewed in FIG. 8.

Initial reference is made to FIGS. 2–4 and 7 & 8 for depicting the sheet tensioning assembly 62. In this embodiment, the sheet tensioning assembly 62 is segmented and includes a plurality of axially spaced apart elastomeric peel tension rollers 74; each having a generally tubular shape. Each of the peel tension rollers 74 is rotatably mounted on an elongate and stationary mounting axle 76 which, in turn, is mounted to extend transversely to the direction of sheet feeding. The mounting axle 76 is relatively flexible and such flexibility enables the rollers 74 to follow the contours of the peel bar. The mounting axle 76 is mounted within a curled portion 78 at a distal end of each of a plurality of axially spaced apart wire springs 80a, one of which is depicted in FIG. 7. Each of the wire springs has a proximal end pivotally attached to an axle 84 that is mounted on the underside of a sheet guide plate 86. The guide plate 86 is connected to and between the peel frame sideplates 88 (FIG. 9). The use of wire springs allows each of the rollers 74 to abut each other. In this regard, an axial adjusting nut or the like (not shown) forces the rollers 74 into lateral abutting relationship with each other.

There is provided a pair of axially spaced apart and depending actuator posts 90 (only one is shown) which have one end of a pair of springs 92 attached to them, while the other spring ends are fixedly attached to each frame sideplate. The springs 92 are arranged to normally bias the actuator posts 90 and thereby the tension rollers 74 to their sheet engaging position; see the solid line position thereof in FIGS. 2, 4, and 8, whereby tension is provided on any sheet being squeezed thereby. The tension rollers 74 are moved to their inoperative position by having the biasing force of the springs 92 overcome by the peel tractor roller means. In particular, the peel tractor roller means 68 is operative to engage and pivot the sheet tensioning assembly through the lever 158 and, therefore, its associated tension rollers 74 to their inoperative or non-engaging position, see FIG. 3 as when the peel tractor roller means moves to its pre-peel position. The springs 92 drive the tension rollers 74 to their sheet engaging position when the peel tractor means moves to its peeling position. Referring back to the tension rollers 74, each is self-adjusting for applying uniform pressure against the bottom of the imaging sheets. In this regard, the rollers 74 are made, preferably, of a resilient polyurethane foam material which is sufficiently flexibly resilient for acting as a spring which pinches the sheets. Because the rollers 74 are segmented they provide a consistent force regardless of sheet width. The segmentation provided by the individual rollers 74 insures that tension is applied against the sheet. Because the tension rollers 74 are independently rotatable in order to facilitate continued sheet feeding of multiple sheets of varying widths, at the same time, they can feed the sheets without the need for special instrumentation sensors and the like for measuring sheet dimensions and controlling related sheet feeding and peeling activities. The rollers 74 which are made of a resilient material have the frictional and compressive properties for effecting such spring-like qualities. In addition, they perform the peeling without damaging the film sheet surface. Some of the other materials contemplated by this invention for use in the construction of the rollers include: natural and synthetic rubbers. These materials are illustrative and not limiting.

Referring now to FIGS. 2–4, 7 and 8, the peeling bar assembly 64, includes a main peel bar 94 and an auxiliary peel bar assembly 96, either of which is operative for effecting peeling as will be described. In this embodiment, the main peel bar 94 is defined as an elongate member having locator pins 98 at opposite axial ends thereof which fit within respective openings (not shown) within the peeler frame sideplates 88. In this manner, the main peel bar 96 extends transversely to the feeding path of the imaging sheet 34. The main peel bar 96 has a relatively enlarged and arcuate peel tractor peeling surface 100 which has a configuration that conforms to a portion of the periphery of the peel tractor elements. The peeling surface 100 is generally arcuate, smooth and has a relatively low coefficient of friction so as to enhance peeling. The peeling surface 100 may be coated with a suitable low coefficient of friction material; such as zirconia/Teflon plasma coatings, such coatings are illustrative and not limiting.

Reference is made to FIGS. 2–6 for better illustrating that the main peel bar 94 is provided with a curved peeling edge 104 which has a profile that has been determined to effect desired peeling of the "dupe" film sheet material. In this embodiment, the peeling edge 104 has a radius of curvature in a range from about 0.015 to 0.062 inch. In one preferred embodiment, the radius of curvature is 0.032 inch. An upper portion of the peeling surface 100 terminates at a location 102 relative to the waste conveyor system 72, such that as the leading edge of a throwaway sheet leaves the peel surface, it travels between an elongate and transversely extending lower waste guide member 106, and the lower flights of a series of axially extending 0-ring type conveying belts 108. The operation of the waste conveyor system 72 in removing the throwaway sheet does not, per se, form a part of the present invention.

Figure 2:
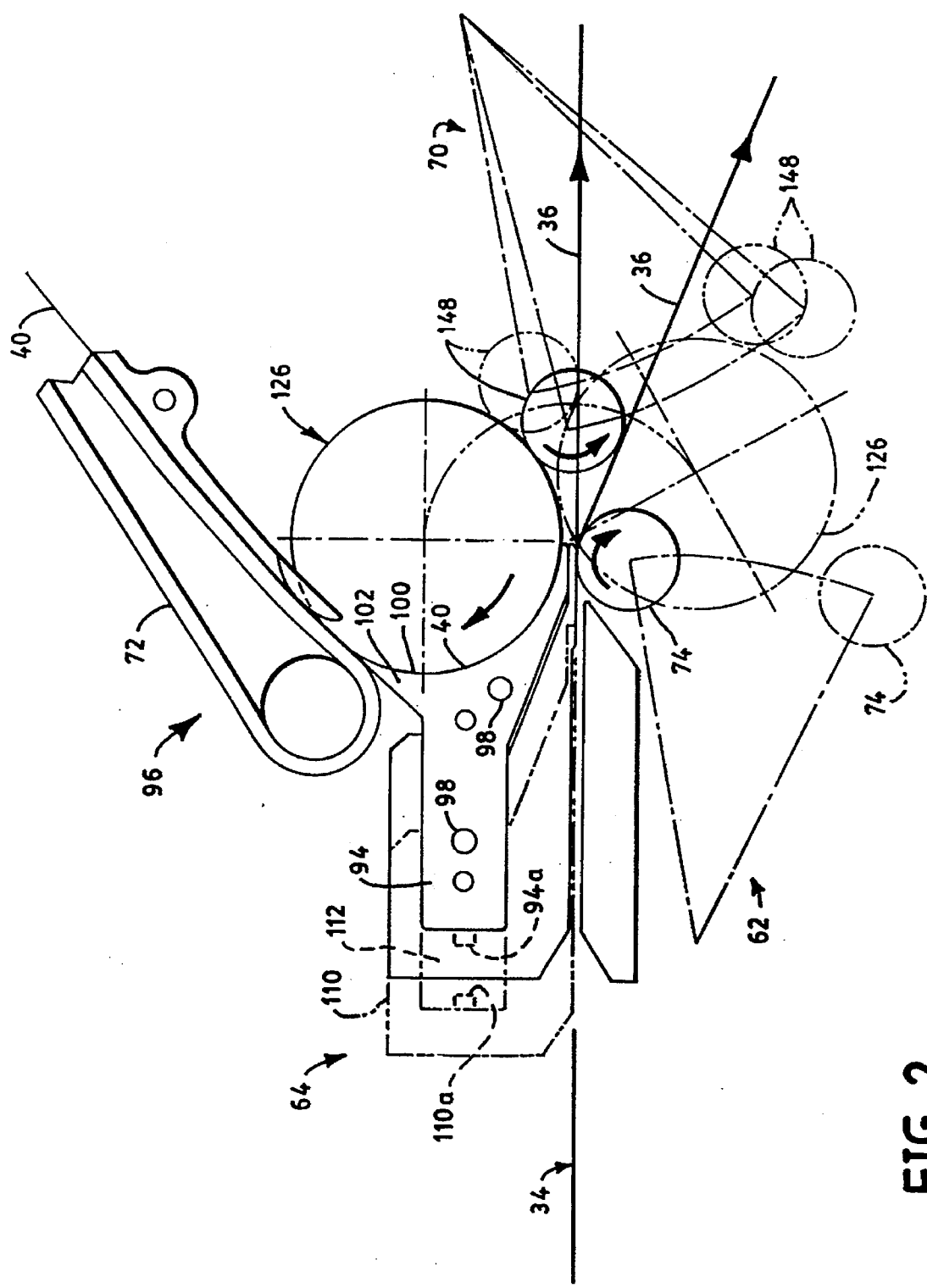
FIG. 2 is a schematic view of an adjustable peeler or delaminating apparatus of the present invention depicted in one mode of operation.
Figure 3:
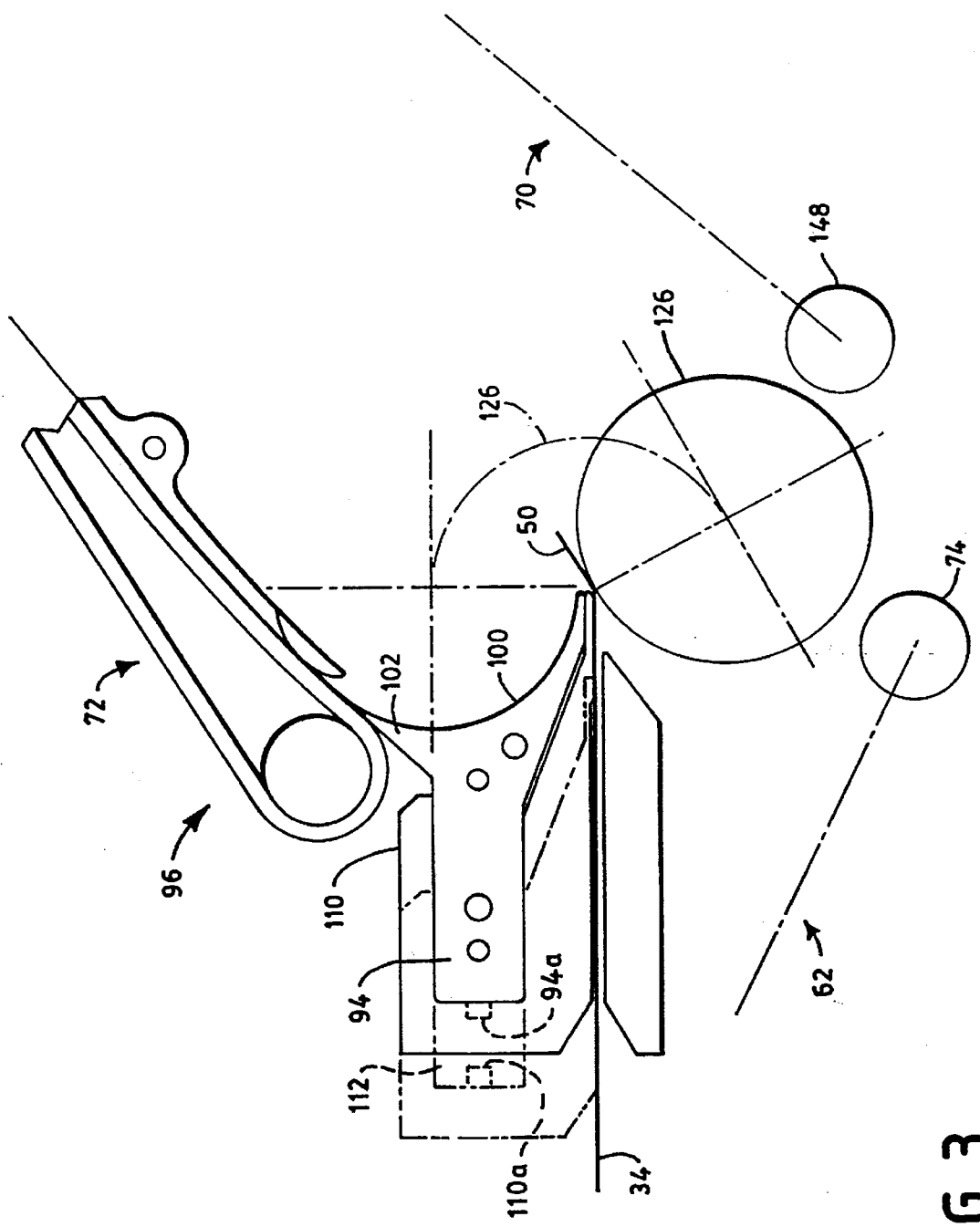
FIG. 3 is a schematic view of the peeler apparatus of FIG. 2, but with the components thereof depicted in another mode of operation.
Figure 4:
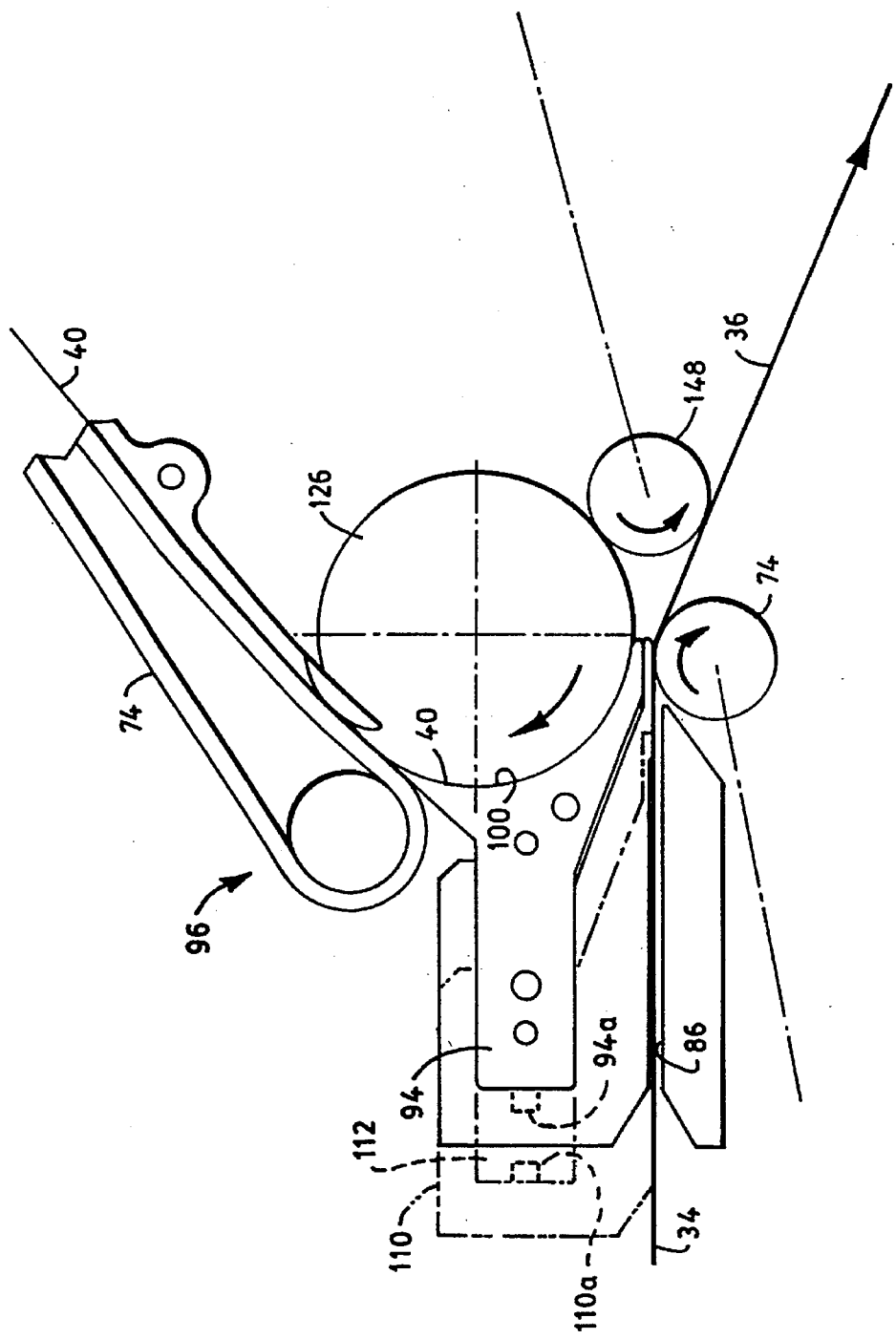
FIG. 4 is a schematic view of the peeler apparatus depicted with the components thereof in still another mode of operation.

If it is desired to peel "contact" sheet material, the auxiliary peel bar assembly 96 is moved from its inoperative position, as shown by dotted lines in FIGS. 2–4, to its operative position as depicted by solid lines in FIGS. 2–4. In the illustrated embodiment, the auxiliary peel bar assembly 96 includes a generally elongated auxiliary peel bar 110 having a generally U-shaped cross-section which defines a longitudinally extending central cavity 112 that has a sliding relationship with the main peel bar 94. For the sake of compactness, an air cylinder 114 is mounted to peel bar 110. For the sake of compactness it is mounted along a longitudinal axis of the auxiliary peel bar 110. Actuation of the air cylinder 114 extends its piston rod along the axis of the auxiliary peel bar 110. Because of a cam follower 116 which is attached to the piston rod and which is riding in an angled cam slot 118 and a similar arrangement (not shown) on the other end, such motion is converted into corresponding sliding motion of the auxiliary peeling bar 110 in the direction which is generally parallel to the sheet feeding path. The auxiliary peel bar 110 moves to the operative position as shown by the solid lines in FIGS. 2–6 and is stopped there when mating peel bar surfaces 94a, 110a (FIG. 8) contact. Retraction of the piston rod will move the auxiliary peel bar 110 to the non-operative position shown in phantom lines in FIGS. 2–4.

Figure 5:
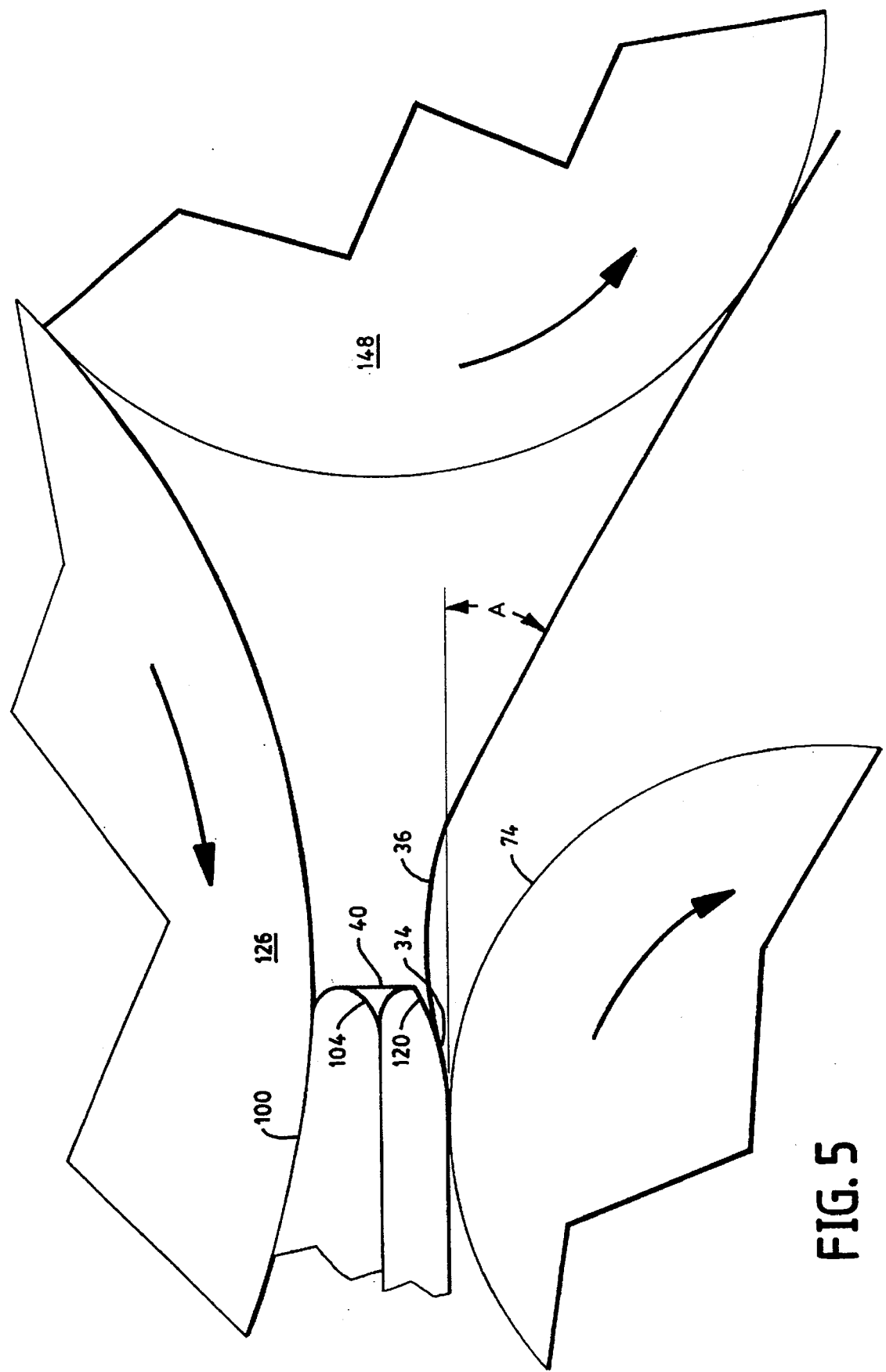
FIG. 5 is an enlarged schematic view of a nested pair of peeler bars in one mode of operation corresponding to FIG. 4.
Figure 6:
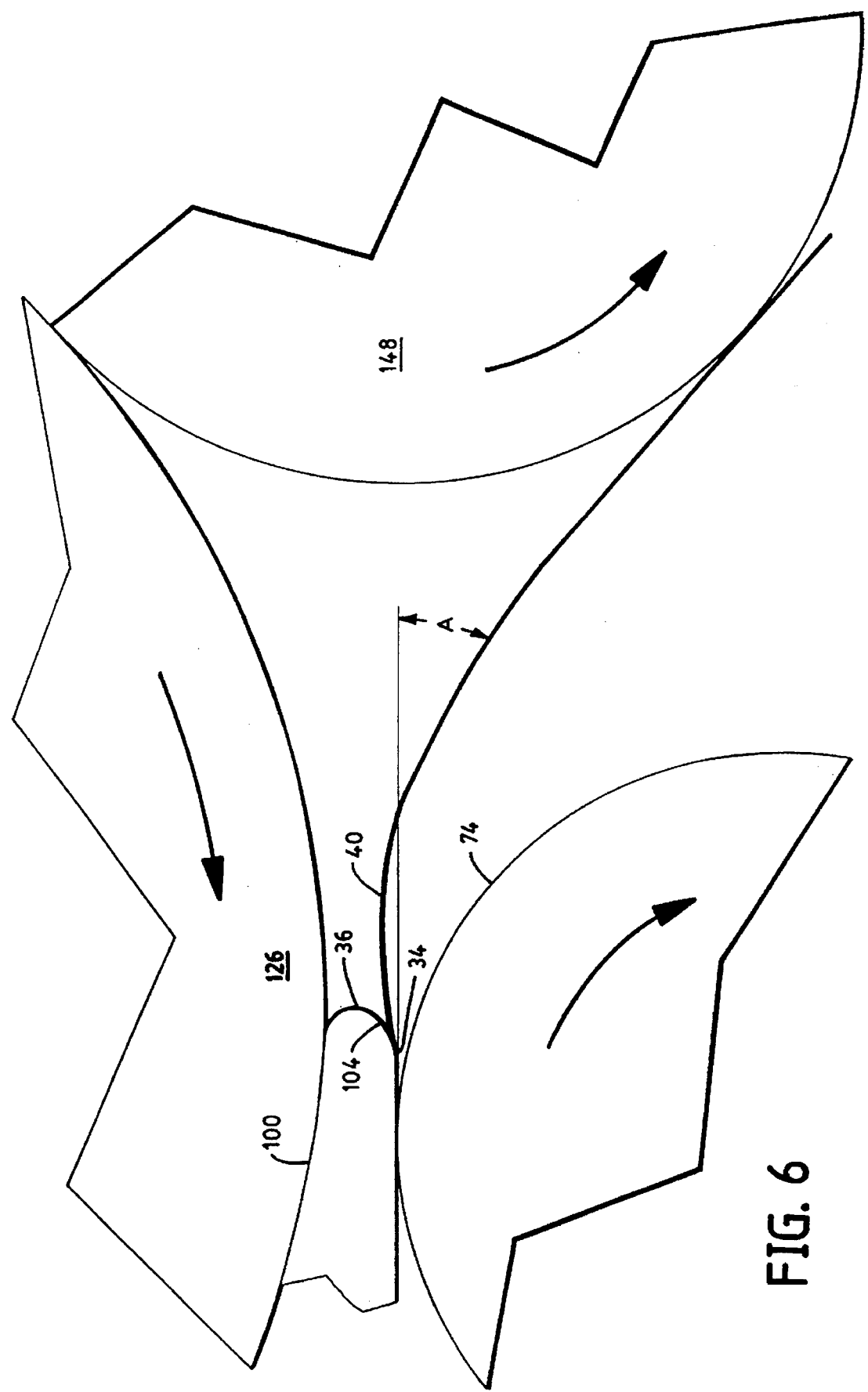
FIG. 6 is an enlarged schematic view of a nested pair peeling bars in another mode of operation.

In this embodiment, the auxiliary peel bar 110 has an elongated peeling edge 120 which has a peeling profile as illustrated that has been determined to be effective in peeling of the "contact" film sheet material. In this regard, the curved peeling edge 120 has a preselected radius of curvature; which radii can in this embodiment range from about 0.015 to 0.250 inch. In a preferred embodiment, the radius is 0.062 inch. Other radii of curvature are contemplated depending on the type of material being peeled. It will be appreciated that whatever the peeling characteristics of the material being peeled are, the peeling edge profile should be selected so as to effect the desired peeling. As illustrated when the auxiliary peel bar 110 is in its operative position as seen in FIGS. 3–5, both the peeling edges 104 and 120 are generally vertically aligned so that the peeling edge 104 does not interfere with the operation of the peeling edge 120 of the auxiliary peeling bar 110. While this embodiment depicts a nested arrangement of the peeling bars, it will be appreciated that the present invention contemplates other constructions wherein different peeling edge configurations can be placed in operative relationship for effecting the peeling of laminated sheets having different peeling characteristics.

Reference is now made to the peeling tractor means or mechanism 68 which includes a peel tractor roll assembly 122, and a peel tractor roll drive assembly 124. The tractor roll assembly 122 comprises a plurality of axially spaced apart tractor tires or ring elements 126 which are mounted on a peel traction drive shaft 128. The tractor rings 126 are effective for engaging the tab and throwaway sheet as will be described. In this embodiment, the tractor rings 126 are about ¼ inch wide and are spaced apart by about 1 inch. Other tire dimensions and spacings are contemplated. The tractor rings 126 are, preferably, flat faced and made of polyurethane.

Figure 7A:
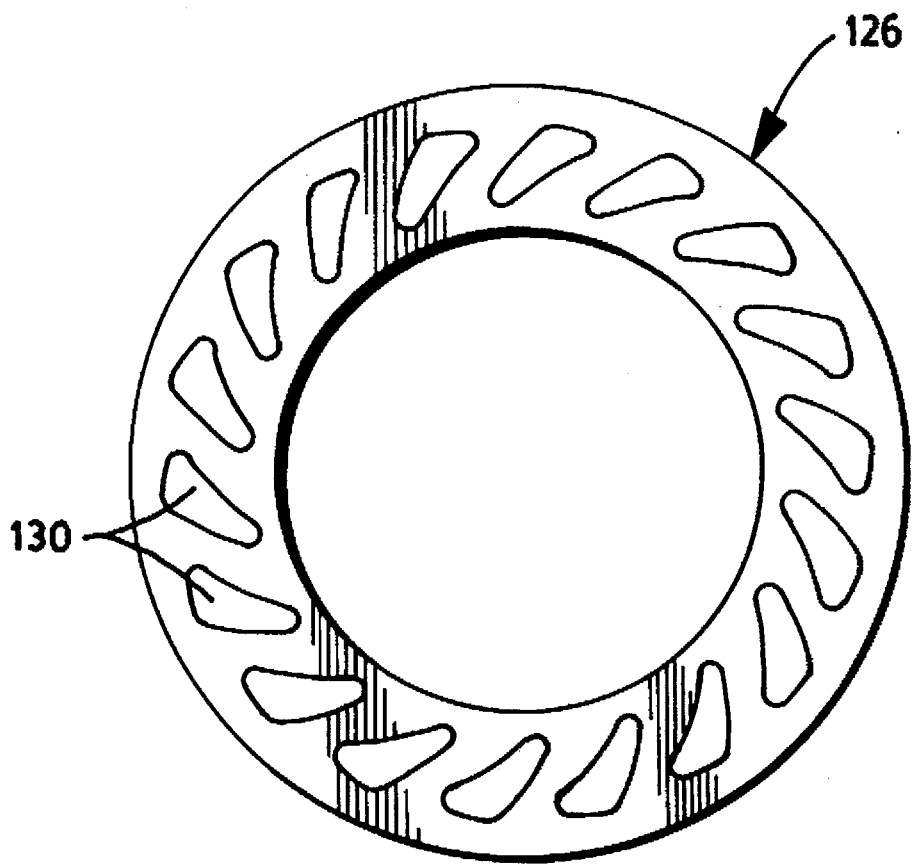
FIG. 7A is a side elevational view of one of the traction ring elements.
Figure 8:
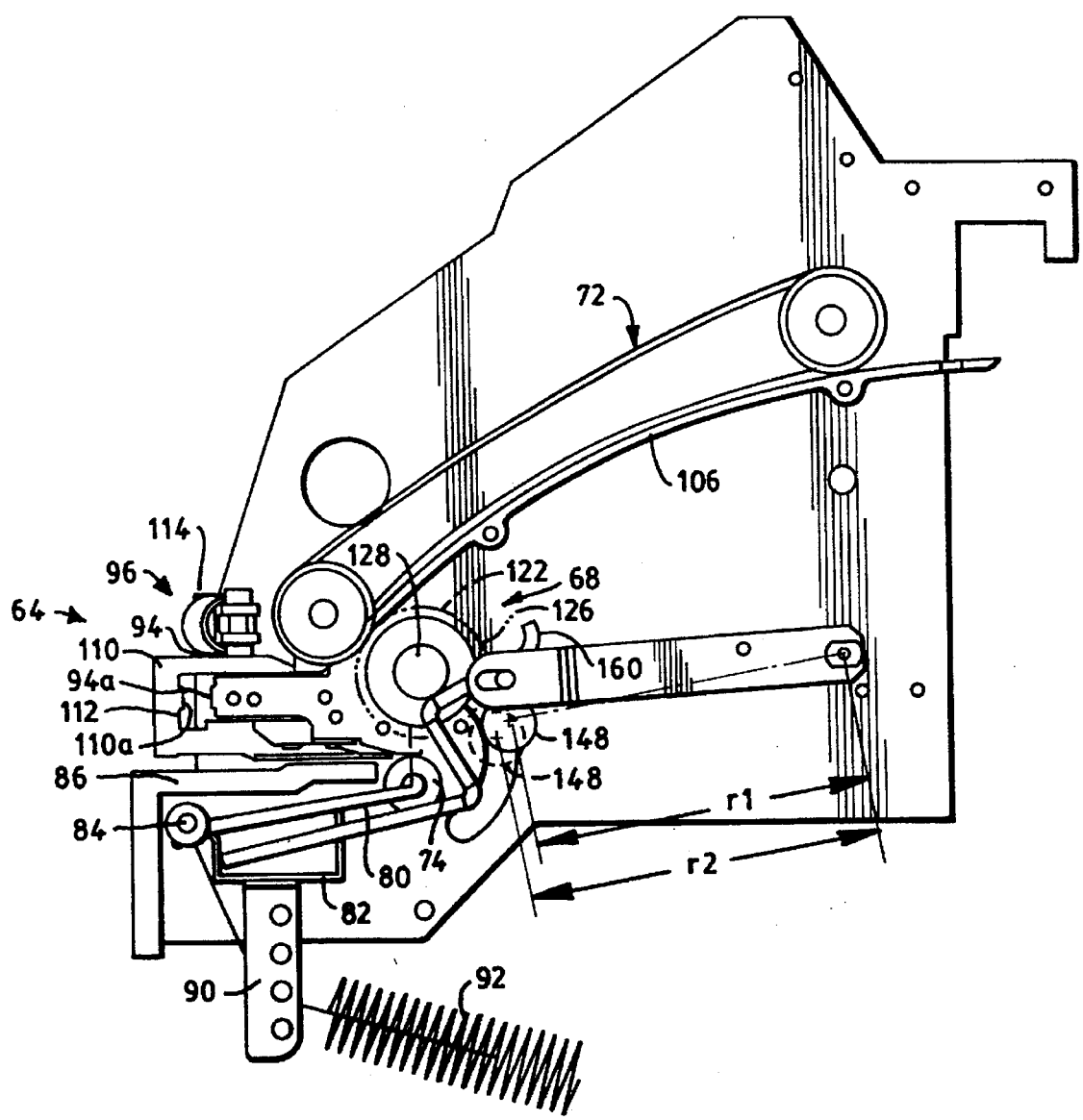
FIG. 8 is a side elevational view of FIG. 7.

As seen in FIG. 7A, the tractor rings 126 have a plurality of voids 130 having a size and configuration, such as the type shown in the drawings, formed therein which enhance radial compressibility of the ring and hence, conformity of the tractor rings to the peel bar. However, the voids 130 are formed so as to avoid diminishing the torsional stiffness of the ring 126. In this embodiment, the rings 126 are made of a compressible polyurethane having durometers of for example, 75–85 Shore A, but can be made of other suitable materials having other hardness. Polyurethane is preferred, because it has a relatively high coefficient of friction and desirable torsional stiffness and abrasion resistance. As a result, polyurethane provides the necessary sheet friction drive and, importantly, does not damage the surface of the sheets being peeled. Other materials which can accomplish the above advantages can, of course, be used, such as comparable natural or synthetic rubbers.

As will be described, as the peel tractor drive shaft 128 is driven upwardly in a circular arc from its pre-peel position (FIG. 2) below the peel bar assemblies to its peeling position (FIG. 4–6), it breaks the frangible tab 50 and bends the latter onto the peel surface 100. As the peel tractor shaft 128 rotates about its own longitudinal axis, it commences peeling of the throwaway sheet between the tractor rings 126 and the peeling traction surface 100. It will be noted that the peeling is performed by the tractor rings 126 driving the throwaway sheet in the direction of the arrows. The rotational speed of the shaft 128 can be adjusted to whatever speeds are desirable for peeling a particular medium. Because of the natural arc swing of the peel tractor roll assembly 126, the frangible tab and the leading edge of the throwaway sheet 40 are wrapped tightly onto one or both of the noted peeling edges 104 and 120; depending on whether the contact or dupe material is being delaminated. This arc swing has been determined to avoid the formation of a space or gap between the sheet 34 and the peeling edges. Presence of such a space has been determined to have a tendency which results in the formation of image artifacts being present in the final product. The peeling action results in the throwaway sheet 40 being peeled by the peel tractor roll, while the keeper sheet advances towards a laminating station, whereat the surface thereof is protected with a laminating coating.

The lamination step does not form part of the present invention.

Figure 10:
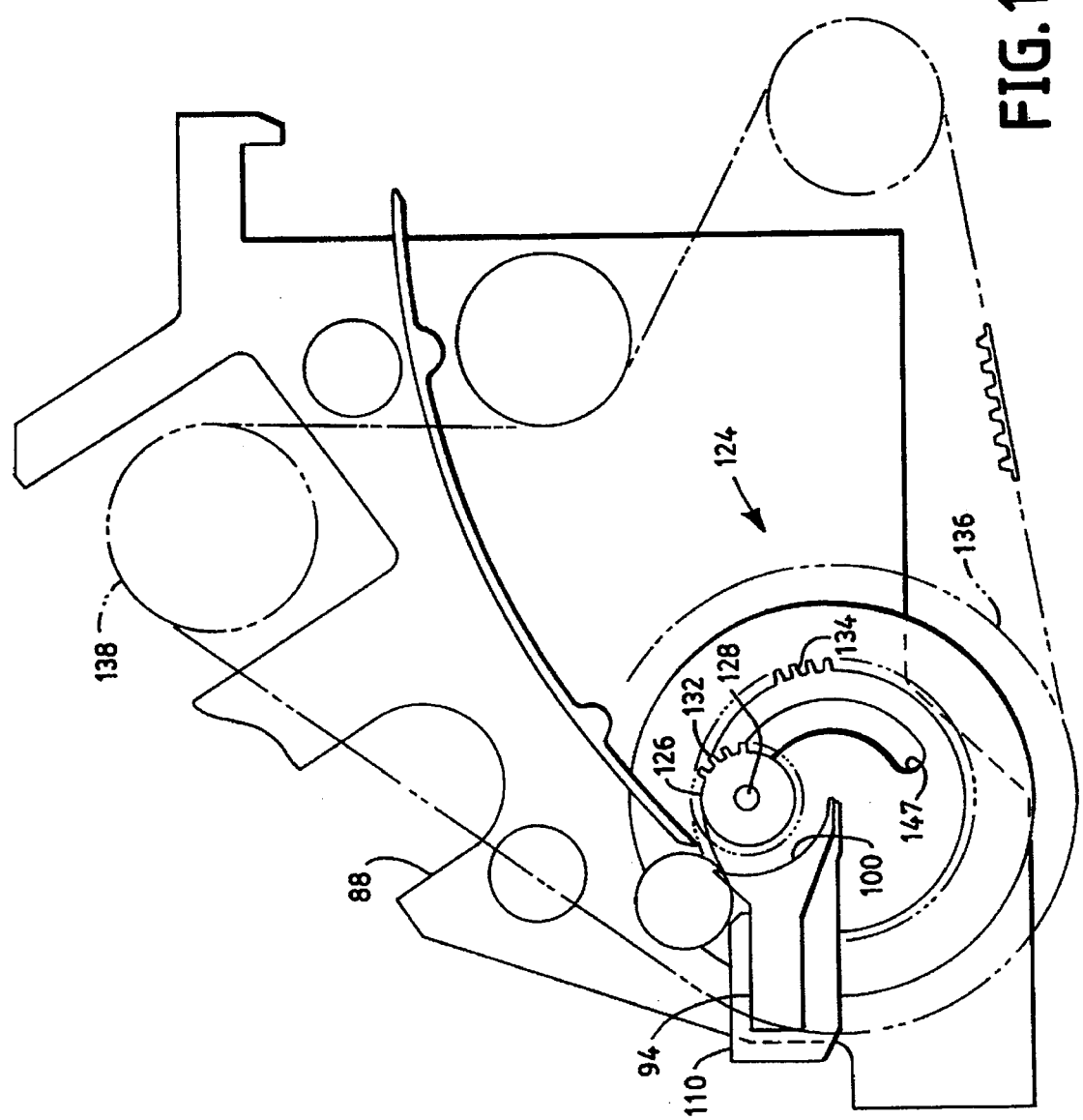
FIG. 10 is a partial view of the drive components of the peeler assembly.
Figure 11:
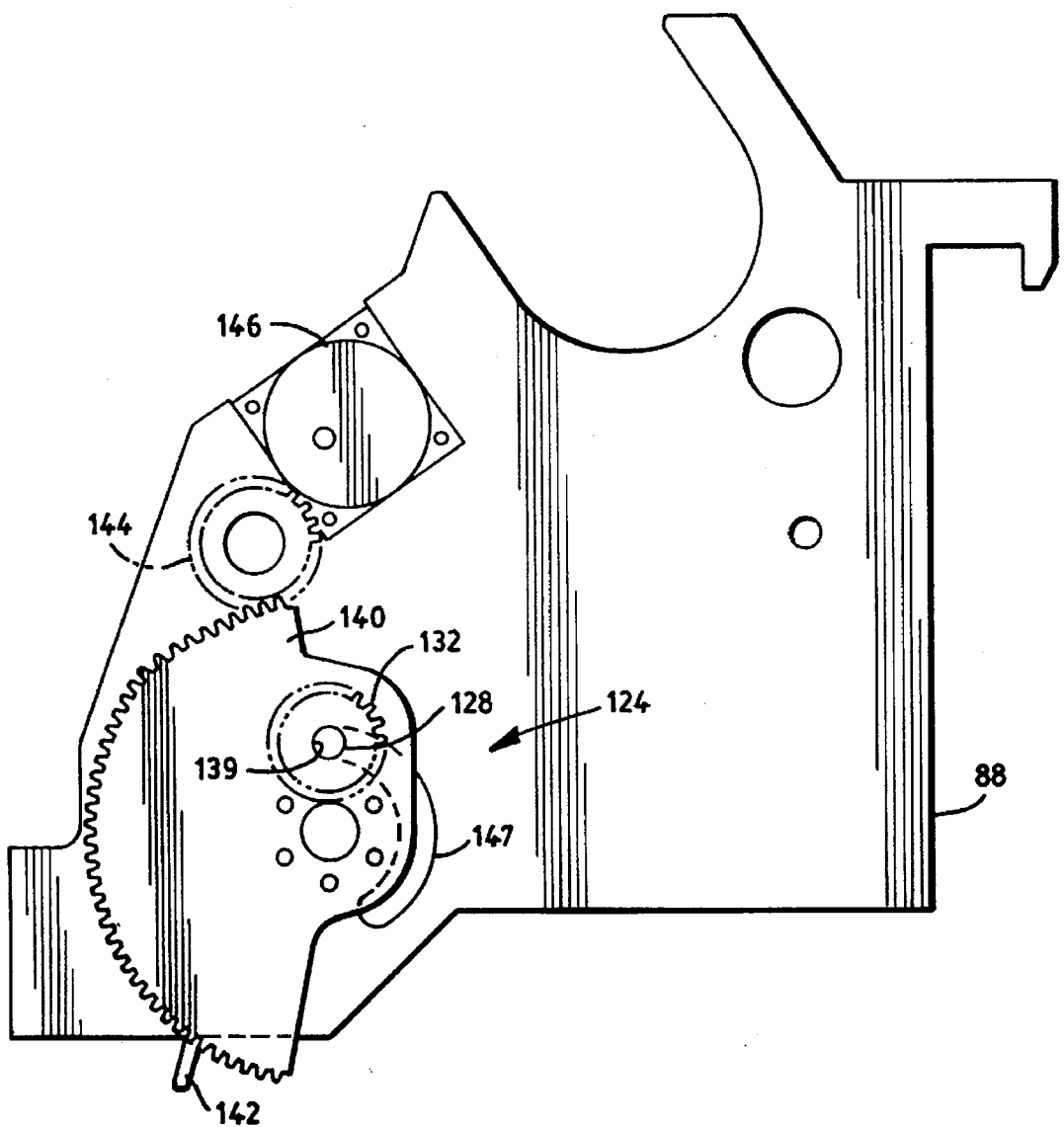
FIG. 11 is a partial view of other drive components of the peeler assembly.

Reference is now made to FIGS. 9–11 which better illustrate the tractor roller drive assembly 124. One end of the peel tractor shaft 128 has a pinion gear 132 attached thereto for meshing cooperation with the internal circumferential teeth of a ring-gear 134. The ring-gear 134 is mounted for rotation on a sidewall 88 of the peeler and is directly coupled to a coaxially arranged input pulley 136 which is driven through a drive belt by a source of rotational power, such as d.c. motor 138. Hence, rotation of the input pulley 136 drives the ring-gear 134 which, in turn, rotates the peel tractor roller drive shaft 128. As noted, the rotational speed of the peel tractor rings 126 is selected to achieve the desired continuous peeling action. The speed will depend on the type of material being peeled. As described more fully in the last noted application, the d.c. motor 138 also drives the waste conveyor or stacker system 72.

For effecting the noted up and down swinging action of the peel tractor drive shaft 128 between the pre-peel position and the peeling position, the latter is mounted in a bearing (not shown) carried in a bore 139 of a crankplate 140 only one of a pair is depicted.

The crankplate 140 is mounted for oscillatory movement on one side of the peeler frame assembly, while the other crankplate 140 is mounted for similar movement on the opposite side of the peeler frame assembly. The crankplate 140 has a segmented plurality of teeth 142 along one arcuate edge thereof which meshes with teeth of one of a pair of drive pinion gears 144 that is mounted to a common shaft rotatably driven by a d.c. motor 146 which can be operated so as to either raise or lower the crankplate and, therefore, the peel tractor roll drive shaft 128. The common shaft is connected to and between the sideplates.

As a result, the peel tractor roll assembly 122 is cranked from the pre-peel position, as shown in FIG. 3 to the peeling position as shown in FIG. 4 in a natural swinging or rotating action. During this generally circular motion, the tractor tires 126 engage the tab 50, FIG. 3, and urge the throwaway sheet 40 to its folded over position relative to one of the peel edges.

For this to happen, each of the peeler sideframes has an arcuate slot 147, only one is illustrated, which allows the peel tractor shaft to move in a generally circular path in order to effect the foregoing swinging displacement. Also, the tab 50 is fed to a controlled position located adjacent the edge of one of the peeling bars (FIG. 3). The position of the sheet 34 is controlled by position sensors, not shown, and the operation of the in-feed rollers of the in-feed mechanism 58. Specifically, the position of the sheet is such that a hinge of the tab 50 is located in juxtaposed relationship to at least one of the peel edges so that the tab can be folded in relative tight engagement thereover in a manner which avoids the formation of bags. As the peel tractor roller drive shaft moves to the peeling position, the tires 126 bend the tab over the peel edge and into intimate engagement with the peel slip surface 100. This acts to minimize the formation of a bag or space existing between the throwaway sheet and the peel edge. The peel traction roll shaft 128 is driven by the ring-gear and pinion gear arrangement at a predetermined speed. The speed is selected to effect the desired peeling of the medium in a manner which does not form image artifacts. For peeling the noted contact and dupe material, the rotational speeds of the shaft 128 can be varied. In this embodiment the speeds can range in the order of about 1–12 inches per second. However, other speeds can be used depending on the type of material being peeled. In this embodiment, the pinion gear and the ring-gear have a constant center distance therebetween and thus remain in perfect engagement as the peel tractor roll is swung in its circular path. Otherwise complicated mechanisms would have to take into account the fact that there is a swinging rotational axis for the peel roller.

As noted, the keeper sheet 36 is delaminated from the throwaway sheet 40. Reference is made to FIGS. 3–6 for illustrated how the keeper sheet 36 is deflected by the adjustable keeper deflector assembly 70. Deflection of the keeper sheet 36 is one of the peeling parameters for controlling the nature of peeling. In this regard, the deflection angle A of the keeper sheet 40 is selected so as to effect the desired peeling without appreciable defects. The adjustable keeper deflector assembly 70 includes an elongate deflecting roller 148 which is rotatably mounted on a shaft 149 and extends transversely to the sheet feeding path. The roller 148 is made of polished steel with a release coating which does not damage any of the sheet medium in engagement therewith. Other suitable materials can also be used. The deflecting roller 148 is in engagement with the traction tires when they are in their operative positions and freely rotates in response to the rotational motion of the traction tires 126. Each axial end of the shaft 149 extends through a slot 150 and is retained for rotation therein and for limited axial movement in a distal end of a pivotal arm retainer member 152. The retainer arms 152 are pivotally attached to the peeler frame sideplate 88 and are biased upwardly by a spring 154 so that the deflector assembly can follow the movement of the traction roller as described. For adjusting the deflection angle, there is provided a motive power source, such as an air cylinder 156 which is coupled to one end to the shaft 149, such that extensions and retractions of an air cylinder piston causes corresponding linear movement of the deflector roller shaft 149 and hence the deflector roller 148 into one of two distinct positions. These two positions of the roller 148 relative to the pivot axis of the retainer arm 152 provide for two distinct deflection angles of the keeper sheet 36. Each of the selected respective deflection angles enhances peeling of a contact medium and a dupe medium. Other mechanisms are contemplated for controlling the position of the deflector roller 148. For peeling the dupe sheet, the deflection angle A of the keeper sheet 40 leaving the peel nip, such as viewed in FIG. 6 can be in a range of about 0° to 20°. For peeling the contact sheet, the deflection angle can be in a range of about 0° to 20°.

Since the adjustable deflection roller assembly 70 is passive it will follow the noted movement of the peel tractor roll assembly. The deflecting roller 148 engages the tractor ring elements 126 and is driven thereby, whereby both the deflecting roller and the tractor rings rotate at the same speeds and therefore do not impart any scuff marks to the keeper sheet 40. The keeper deflector roller 148 moves from its operative position (see the solid lines in FIG. 2) to its inoperative position (see the phantom lines in FIG. 2) when the peel tractor roll assembly 122 moves from its peeling position (see solid lines of FIG. 2) to its pre-peel position (see phantom lines in FIG. 2). It will be noted that the deflector roller 148 is spaced from the tractor rings 126 when both are in their inoperative positions so as to avoid flats forming on mutually engaging peripheral surfaces of the rollers.

Also, the tensioning rollers 74 are spaced from the tractor tires 126 when both are in their inoperative modes. In this regard, a lever 158 (FIG. 7) is mounted on the tensioning assembly for movement therewith. The lever 158 has one arm 160 the lower edge of which engages a portion of the deflector shaft 149 and the upper side of which engages the peel roller shaft 128. As the lever 158 rotates about 84 it is pushed by the peel roller shaft downwardly to the pre-peel position, its arm 160 continues to move and force the deflector roller assembly and the tension roller assembly; respectively, from the peel traction tires 126. Although downward deflection is shown and described, it will be appreciated that the present invention envisions upward deflection of the keeper sheet.

After having explained the construction of the peeler apparatus of the present invention, its operation is believed to be self-evident. However, to supplement that description the following sets forth the basic operation of the peeler apparatus. The peel tractor means 68 is actuated to swing upwardly from a pre-peel position (FIG. 2) below and out of the way of an advancing tabbed sheet 34 to the peel position (FIG. 3). In this regard, the crankplate 140 is pivoted upwardly and the peel tractor rings 126 engage and fold the tab 50 upwardly and tightly wraps it about a peeling edge. The tab is folded by the natural circular movement of the peel tractor means. The tab 50 and the waste sheet 38 are adapted to ride upon the low friction arcuate peeling surface 100 of the main peeling bar 94 as the rings 126 rotate at a preselected speed. The speed has been determined to effect the desired peeling of which ever medium is being peeled. When the tractor roll assembly 122 is in its peel position, the throwaway sheet 38 is pinched and positively advanced by the compliant material of the rotating traction rings 126. There is no need for a pair of peel rollers during peeling of the strip sheet since the single peel traction roller assembly 122 is effective to produce peeling.

During the upward movement of the peel traction roller assembly 122 both the passive sheet tensioning assembly 62 and the adjustable keeper deflector roller assembly 70 move from their non-operative positions to their operative positions as indicated in FIGS. 2 and 4–6. As noted, both of the latter two assemblies are spring biased into such positions in response to displacement of the peel traction roller assembly 122 from its pre-peel position to the peel position.

In regard to the tensioning rollers 74, it will be appreciated that since they are passive, they will move under the biasing of the spring 92 and follow the peel traction roller as the latter moves to its sheet driving position. In doing so the tensioning rollers will engage and squeeze the sheet (FIG. 4). The tensioning rollers are allowed to rotate with the passing sheet which is being squeezed thereby.

As shown in FIG. 5, the peel traction roller means 68 is moved with the traction tires 126 forced against a throwaway sheet 40. The tensioning rollers 74 are moved to a position in contact with the sheet medium 34, and the deflector roll 148 is moved to a position to deflect the keeper sheet and feed the keeper sheet 40 outwardly from the peeler delaminator 22. The deflector roller 148 is simultaneously positioned beyond the peel point and is brought into contact with the traction peeler means 68 so as to be driven thereby and thus avoid imparting any scuff marks on the keeper sheet 40. As noted, the deflector roller 148 is adjustable so as to deflect the keeper sheet 36 by a controlled angular deflection. The angular deflections vary based on the type of material being peeled, for example, whether contact or dupe material is being processed so as to insure that the peeling is done in a manner which minimizes introduction of image artifacts in the resulting keeper sheet. For adjusting whether the deflecting roller 148 is positioned in either of its two positions, the air cylinder 156, as noted, changes the radius of curvature of the deflector retainer arm 152 relative to the pivot axis of the latter.

If, on the other hand, it is desired to peel dupe material, then the auxiliary peel bar is moved into its operative position under the control of the air cylinder 114; as seen in FIG. 7. As a result, the peeling apparatus can peel the dupe material as it has peeled the contact material.

Although several specific and preferred methods and apparatus of the present invention have been shown and described above, other variations of the present invention will become apparent to those skilled in the art. The scope of the invention is therefore not limited to the specific forms shown and described but rather is indicated by the claims below.

What is claimed is:

1. An apparatus for delaminating layers of a laminated sheet of imaging medium, wherein the laminated sheet includes an image substrate, an intermediate image forming layer, and an overlying peelable layer, the substrate layer being provided with a frangible tab portion located between a score line in a free surface of the substrate and an adjacent marginal edge of the medium; said apparatus comprising:

a frame assembly, peeling means operatively associated with said frame assembly at said peeling station and being operative for peeling at least a peelable layer of at least one sheet of an imaging medium from a substrate of the imaging medium at a peeling station, wherein said peeling means is adjustable for peeling different sheets of an imaging medium having different predetermined peeling characteristics; wherein said peeling means includes a first peeling means for peeling the peelable layer from a sheet medium having a first set of peeling characteristics; a second peeling means for peeling the peelable layer from a sheet medium having a second set of peeling characteristics; and, means for presenting either of said first or second peeling means to the advancing sheet at said peeling station so as to effect peeling of a corresponding one of the sheet media having the first or second peeling characteristics; respectively, and said presenting means being operable for peeling the peelable layer from the substrate as the sheet medium is advanced therepast.

2. An apparatus for delaminating layers of a laminated sheet of imaging medium, wherein the laminated sheet includes an image substrate layer, an intermediate image forming layer, and an overlying peelable throwaway layer, the substrate being provided with a frangible tab portion located between a score line in a free surface of the substrate and an adjacent marginal edge of the medium; said apparatus comprising: a frame assembly; peeling means operatively associated with said frame assembly at a peeling station and being operative for peeling at least a peelable layer of the imaging medium from a substrate of the imaging medium at said peeling station, wherein said peeling means is adjustable for peeling different sheets of an imaging medium having different predetermined peeling characteristics; wherein said peeling means includes at least a first and a second peeling bar assembly, wherein said second peeling bar assembly is movable relative to said first peeling bar assembly, each of said first and second peeling bar assemblies includes a respective first and second peeling edge; wherein each of said peeling edges is adapted to be at a peeling position at said peeling station, and each of said peeling edges is configured to peel sheets of imaging media having respectively different peeling characteristics; wherein said peeling means includes means for moving said second peeling bar assembly such that said second peeling edge is at said peeling position; said first peeling bar assembly being stationarily positioned at said peeling station so that said first peeling edge is located at said peeling position; wherein said first peeling bar assembly includes an elongated bar which extends across a path of sheet travel through said peeling means; said second peeling bar assembly is an elongated member having a longitudinally extending cavity which at least partially receives therein said bar of said first peeling bar assembly, and which permits movement of said first peeling bar assembly relative to said second peeling bar assembly.

3. The apparatus of claim 2 wherein said first peeling bar assembly includes peel surface means upon which the peelable layer is supported as it is being peeled from the substrate layer.

4. The apparatus of claim 3 wherein said peel surface means is operative for supporting the peelable layer when said second peeling edge is at said peeling position.

5. The apparatus of claim 4 wherein said peel surface means is an arcuate peeling surface.

6. The apparatus of claim 3 wherein said peeling means further includes:
traction roller means including a traction peel roller assembly which is mounted for movement between a medium non-engaging position and a medium engaging position, wherein whenever said traction peel roller assembly is in said engaging position the peelable layer is engaged thereby for urging and advancing the peelable layer against said peel surface means for effecting peeling.

7. The apparatus of claim 6 wherein whenever said traction peel roller assembly is in said non-engaging position it is positioned below both of said first and second peeling edges; and whenever said traction peel roller assembly moves from said non-engaging position to said engaging position, said traction peel roller means moves upwardly and engages and wraps the tab about at least one or both of said first and second peel edges.

8. The apparatus of claim 7 wherein said peel traction roller means includes a drive assembly which moves said traction peel roller assembly in an arc between said non-engaging position and said engaging position.

9. The apparatus of claim 8 wherein traction peel roller assembly includes a peel shaft which is rotatably driven at preselected speeds, and said drive assembly includes a pinion gear coupled to one end of said peel shaft, and a rotatably driven ring-gear means having an internal tooth assembly which meshes with said pinion gear for rotating said peel shaft and thereby said traction peel roller assembly in response to rotation of said ring-gear means.

10. The apparatus of claim 9 wherein said drive assembly includes a crankplate means mounted to said frame assembly for rotatably mounting said peel shaft for rotation about its longitudinal axis and for movement of said traction peel roller assembly in said arc between said non-engaging and engaging positions.

11. The apparatus of claim 10 wherein said traction peel roller assembly includes a plurality of axially spaced apart drive elements mounted on said peel shaft; said drive elements being made of a compliant elastomeric material which is radially compressible so as to compensate for deviations in the position of said slip surface means, and which has sufficient friction for peeling of the peelable layer.

12. The apparatus of claim 11 wherein said compliant material is made of a group of materials which includes polyurethane, natural and synthetic rubbers.

13. The apparatus of claim 12 wherein said drive elements are rings and have voids formed therein, wherein said voids are formed to enhance the radial compressibility and torsional stiffness of said drive elements.

14. The apparatus of claim 13 further including deflecting means coupled to said frame assembly adjacent said peeling station and being movable to an operative position for deflecting the substrate layer at a location downstream of said traction peel roller assembly by an amount so as to facilitate peeling of the substrate layer as the peelable layer is being peeled by said traction roller means.

15. The apparatus of claim 14 wherein said deflecting means is movable between said operative an inoperative position, and is biased relative to said peel traction means so as to be movable in response to movement of said traction peel roller assembly between said engaging and non-engaging positions; respectively.

16. The apparatus of claim 15 wherein said deflecting means is pivotal about a pivoting axis and includes a deflecting roller, said deflecting roller is movable to a plurality of positions, wherein each of said deflecting roller positions has a different radius relative to said pivoting axis, such that when said deflecting roller is at each of said positions it is responsible for deflecting a peeled substrate sheet at a different angle so as to enhance peeling sheets of imaging medium having different peel characteristics.

17. The apparatus of claim 14 further including advancing means operatively associated with said frame assembly for advancing a sheet of imaging medium along a path to said peeling station.

18. The apparatus of claim 17 wherein said advancing means includes tension roller means mounted on said frame assembly and being operative to move between first and second positions, wherein when in said first position said tension roller means is active for squeezing at least one imaging sheet against a surface of said peeling means so as to create tension on the advancing sheet, whereby said tension roller means effects passive tensioning of the sheet regardless of width and without the need of positively driving the sheet to said peeling position; said tension roller means also being operative to advance a plurality of advancing sheets at the same time and in side-by-side relationship.

19. The apparatus of claim 18 wherein said tension roller means is biased towards said first position and into effective operative relationship with said traction peel roller assembly, such that as said peel roller assembly moves from said non-engaging position to said engaging position said tension roller means moves from said second position to said first position.

20. The apparatus of claim 19 wherein said tension roller means includes a plurality of independently biased rollers, each of which acts independently on an advancing sheet so as to induce drag for creating tension for optimal peeling of the sheet, whereby a plurality of separate sheets can be advanced in side-by-side relationship to said peeling position.

21. The apparatus of claim 20 wherein said roller means is made of a resiliently flexible material which is sized so as to passively engage advancing sheets and squeeze the sheets against a surface of said peeling means.

22. The apparatus of claim 18 wherein said peel traction roll assembly includes means for moving both said deflection roller assembly and said tension roller assembly out of engagement with said traction peel roller assembly when said traction roller means is in its inoperative position.

23. A process of delaminating layers of a laminated sheet of an imaging medium, wherein the laminated sheet includes an image substrate layer, an intermediate image forming layer, and an overlying peelable throwaway layer, the substrate layer being provided with a frangible tab portion located between a score line in a free surface of the substrate and an adjacent marginal edge of the media; said process comprising the steps of:

advancing a sheet of imaging medium along a path to a peeling station;

providing a first peeling means which can peel the peelable layer from a sheet medium having a first set of peeling characteristics;

providing a second peeling means which can peel the peelable layer from a sheet medium having a second set of peeling characteristics;

presenting either of the first or second peeling means to the advancing sheet at said peeling station so as to effect peeling of a corresponding one of the sheet media having the first or second peeling characteristics; respectively, and, peeling the peelable layer from the substrate as the sheet medium is advanced past the peeling station.

24. The process of claim 23 further including the step of moving at least one of the first and second peeling means relative to the other so as to present itself at the peeling station for effecting peeling.

25. The process of claim 24 wherein the peelable layer is supported along and by a peel slip surface as it is being peeled from the substrate layer which peel slip surface is usable with both the first and second peel means.

26. The process of claim 25 wherein said peeling step includes providing a peel traction roller means comprising a peel traction roller assembly which is mounted for movement between a sheet medium non-engaging position and a sheet medium engaging position, whereby whenever the peel traction roller means moves between its operative and inoperative positions; respectively, the traction peel roller assembly is in the engaging position and the peelable layer is engaged for urging and advancing the peelable layer against the peel slip surface for effecting peeling.

27. The process of claim 26 wherein said peeling step includes having the traction peel roller assembly moved to its non-engaging position below both of first and second peeling edges of the first and second peeling means; respectively, and moving the traction peel roller assembly from its non-engaging position to its engaging position so that it moves upwardly and engages and wraps the tab portion of a sheet medium about at least one or both of first and second peel edges.

28. The process of claim 27 wherein the traction peel roller assembly is rotated at different preselected speeds for the different sheet media having the different peeling characteristics.

29. The process of claim 28 wherein the step of providing the traction peel roller assembly includes the step of providing a plurality of axially spaced apart drive elements mounted on a peel shaft, wherein the drive elements are made of a compliant elastomeric material which is radially compressible so as to compensate for deviations in the position of the peel surface and which has sufficient friction for uniform peeling of the peelable layer.

30. The process of claim 29 wherein the compliant material provided is made of a group of materials which includes polyurethane, natural and synthetic.

31. The process of claim 30 wherein the drive elements provided are rings with voids formed therein to enhance the radial compressibility and torsional stiffness of the rings.

32. The process of claim 29 further including the step of deflecting the substrate layer adjacent the peeling station, at a location downstream of the peeling station, as the sheet medium is being peeled by the traction peel roller means so as to facilitate peeling of the substrate layer.

33. The process of claim 32 wherein said deflecting step includes the step of deflecting the substrate layer by different amounts depending on the peeling characteristics of the media being peeled, wherein said step of deflecting by different amounts includes use of a deflection roller which is movable to at least two distinct positions when in an operative position.

34. The process of claim 33 wherein the deflecting means is movable between its operative and inoperative positions and is biased relative against the peel traction means so as to be movable in response to movement of the peel traction roller means between the engaging and non-engaging positions; respectively.

35. The process of claim 34 wherein said step of advancing the sheet medium includes the step of providing tension roller means which includes a plurality of individual tension rollers being operative to move between first and second positions, wherein when the rollers are in the first position the tension rollers are biased for active squeezing of at least one imaging sheet medium against a surface of at least one of the first or second peel means so as to create tension on the advancing sheet medium, whereby the tension roller means effects passive tensioning of the sheet regardless of width and without the need of positively driving the sheet to said peeling station; the tension roller means also being operative to tension a plurality of advancing sheets at the same time and in side-by-side relationship.

36. The process of claim 35 wherein said step of providing the tension rollers includes biasing the rollers to the first position and into effective operative relationship with the peel traction roller assembly, such that as the peel traction roller assembly moves from the non-engaging position to the engaging position, the rollers move from the second position to the first position.

37. The process of claim 36 wherein the step of providing the tension rollers includes providing rollers which act independently to bias the advancing sheet for inducing drag on the sheet sufficient for creating the tension for assisting in the optimal peeling of the sheet.

38. The process of claim 37 wherein the step of providing rollers includes providing rollers which are resiliently flexible and are sized so as to engage the advancing sheets and squeeze them against a surface of one of the first or second peeling means.

39. The process of claim 38 further including the step of maintaining the tension rollers and the deflecting roller out of engagement with the traction peel roller assembly when the latter is in its inoperative condition.

* * * * *